United States Patent
Liu et al.

(10) Patent No.: US 9,348,035 B2
(45) Date of Patent: May 24, 2016

(54) SYSTEMS AND METHODS FOR SELECTABLE DETECTOR CONFIGURATIONS

(71) Applicant: General Electric Company, Schenectady, NY (US)

(72) Inventors: James Zhengshe Liu, Salt Lake City, UT (US); Paul Richard Granfors, Berkeley, CA (US)

(73) Assignee: General Electric Company, Schenectady, NY (US)

( * ) Notice: Subject to any disclaimer, the term of this patent is extended or adjusted under 35 U.S.C. 154(b) by 123 days.

(21) Appl. No.: 14/060,018

(22) Filed: Oct. 22, 2013

(65) Prior Publication Data

US 2015/0108354 A1  Apr. 23, 2015

(51) Int. Cl.
   *G01T 1/29* (2006.01)
   *G01T 1/20* (2006.01)
   *H01L 27/146* (2006.01)

(52) U.S. Cl.
   CPC ........ *G01T 1/2018* (2013.01); *H01L 27/14607* (2013.01); *H01L 27/14663* (2013.01); *G01T 1/2006* (2013.01); *G01T 1/2985* (2013.01)

(58) Field of Classification Search
   CPC .............................. G01T 1/2985; G01T 1/2006
   See application file for complete search history.

(56) References Cited

U.S. PATENT DOCUMENTS

| | | | |
|---|---|---|---|
| 4,499,654 A | 2/1985 | Nishizawa et al. | |
| 5,051,797 A | 9/1991 | Erhardt | |
| 5,070,380 A | 12/1991 | Erhardt et al. | |
| 5,198,673 A * | 3/1993 | Rougeot et al. | 250/370.11 |
| 5,625,210 A | 4/1997 | Lee et al. | |
| 5,841,159 A | 11/1998 | Lee et al. | |
| 5,880,495 A | 3/1999 | Chen | |
| 6,051,447 A | 4/2000 | Lee et al. | |
| 6,080,600 A | 6/2000 | Sugiyama et al. | |
| 6,090,639 A | 7/2000 | Pan | |
| 6,150,189 A | 11/2000 | Pan | |
| 6,265,241 B1 | 7/2001 | Pan | |
| 6,372,537 B1 | 4/2002 | Lee et al. | |
| 6,404,851 B1 * | 6/2002 | Possin et al. | 378/98.7 |
| 8,324,586 B2 * | 12/2012 | Schmidt | G01T 1/17 250/370.01 |
| 2010/0329421 A1 * | 12/2010 | Ruetten et al. | 378/62 |
| 2011/0108735 A1 * | 5/2011 | Ruetten et al. | 250/371 |
| 2013/0001427 A1 * | 1/2013 | Okada | 250/370.09 |
| 2013/0099099 A1 * | 4/2013 | Anaxagoras | 250/208.1 |
| 2014/0246561 A1 * | 9/2014 | Chen et al. | 250/208.1 |

* cited by examiner

*Primary Examiner* — Christine Sung
(74) *Attorney, Agent, or Firm* — Dean D. Small; The Small Patent Law Group, LLC.

(57) ABSTRACT

An X-ray detector includes a light sensor configured to receive light energy from a scintillator receiving X-rays. The light sensor includes a grid of pixels having a light reception surface oriented toward the scintillator and configured to receive light from the scintillator. Each pixel includes a diode assembly, a control assembly and a capacitor assembly. The diode assembly is disposed on the light reception surface and is configured to produce electric charge responsive to light received by the diode assembly. The diode assembly includes plural diodes selectably configurable in plural combinations, wherein an amount of the electric charge produced by the diode assembly varies based on a selection of diode combination. The control assembly is operably connected to the diode assembly and configured to selectably configure the diodes. The capacitor assembly is operably connected to the diode assembly and configured to receive and store the electric charge from the diode assembly.

16 Claims, 6 Drawing Sheets

SYSTEMS AND METHODS FOR SELECTABLE DETECTOR CONFIGURATIONS

BACKGROUND OF THE INVENTION

The subject matter disclosed herein relates generally to imaging systems and techniques, and more particularly to detectors having selectable configurations for varying radiation dosages.

Different types of X-ray detectors may be used for different applications. For example, complementary metal oxide semiconductor (CMOS)-based detectors may be used for some applications, and amorphous silicon-based detectors may be used for others. CMOS-based detectors may provide substantially lower electronic noise than amorphous silicon-based detectors in some applications. For example, CMOS-based detectors may provide lower electronic noise in relatively low radiation saturation dose environments. However, when the amount of radiation used is increased to, for example, 5 milliRoentgen (mR) per frame, the level of electronic noise in a CMOS-based detector may no longer provide a benefit compared to traditional amorphous silicon-based X-ray detectors.

One component of the electronic noise of a CMOS-based detector is proportional to the capacitance of the capacitor that holds electric charge produced by the detector. The higher the saturation dose or amount of radiation used in an exposure, the more electrons or charge will need to be held by the capacitor, and the larger the capacitance of the capacitor will be. With larger capacitance, more electronic noise will be present.

Thus, a CMOS-based detector with a low enough capacitance to provide a desired low level of noise for low radiation dosage exposures may not be appropriate for use with exposures at higher levels of radiation dosage. Similarly, a CMOS-based detector with a high enough capacitance for use at higher levels of radiation dosage exposures may have more electronic noise than is desirable for exposures using lower levels of radiation dosage. Accordingly, a single detector may not be appropriate for various different exams, and different detectors may be used for different exams. However, use of different detectors results in additional equipment costs, training costs, and maintenance costs, among others, as well as the time and inconvenience associated with switching detectors between procedures or among systems.

BRIEF DESCRIPTION OF THE INVENTION

In accordance with various embodiments, an X-ray detector is provided. A light sensor of the X-ray detector is configured to receive light energy from a scintillator receiving X-rays transmitted from a source through an object to the scintillator. The light sensor includes a grid of pixels having a light reception surface oriented toward the scintillator and configured to receive light from the scintillator. Each pixel includes a diode assembly, a control assembly, and a capacitor assembly. The diode assembly is disposed on the light reception surface and is configured to produce electric charge responsive to light received by the diode assembly. The diode assembly includes plural diodes selectably configurable in plural combinations, wherein an amount of the electric charge produced by the diode assembly varies based on a selection of diode combination. The control assembly is operably connected to the diode assembly and configured to selectably configure the diodes. The capacitor assembly is operably connected to the diode assembly and configured to receive and store the electric charge from the diode assembly.

In accordance with various embodiments, a method for manufacturing an X-ray detector including a light sensor configured to receive light energy from a scintillator is provided. The method includes providing a diode assembly on a light reception surface of the pixel. The diode assembly includes plural diodes selectably configurable in plural combinations, wherein an amount of electric charge produced by the diode assembly varies based on a selection of diode combination. The method also includes providing a capacitor assembly operably connected to the diode assembly. The capacitor assembly is configured to receive and store the electric charge from the diode assembly.

In accordance with various embodiments, a method for using an X-ray system including a detector including a light sensor configured to receive light energy from a scintillator is provided. The method includes receiving, at a processing unit, an input corresponding to a radiation dosage to be used during an imaging procedure. The method also includes selecting, with the processing unit, a first diode combination to activate a first subset of light sensing areas of the light sensor when the input corresponds to a first level of radiation. The method also includes selecting, with the processing unit, a second diode combination to activate a second subset of light sensing areas of the light sensor when the input corresponds to a second level of radiation.

DETAILED DESCRIPTION OF THE INVENTION

Figure 1:
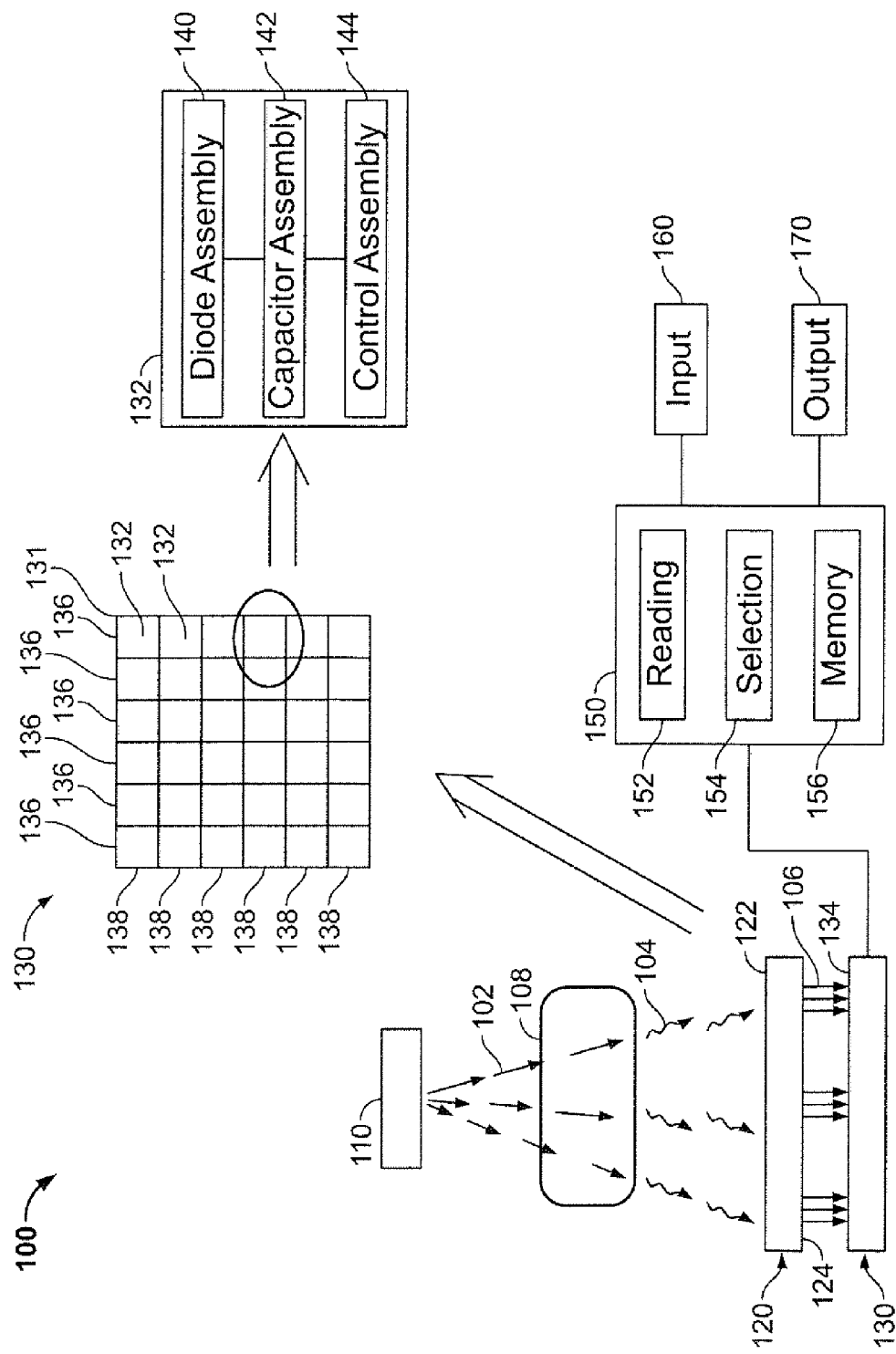
FIG. 1 is a schematic diagram of an imaging system in accordance with various embodiments.

The following detailed description of certain embodiments will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (e.g., processors or memories) may be implemented in a single piece of hardware (e.g., a general purpose signal processor or random access memory, hard disk, or the like) or multiple pieces of hardware. Similarly, the programs may be stand-alone programs, may be incorporated as subroutines in an operating system, may be functions in an installed software package, and the like. It should be understood that the various embodiments are not limited to the arrangements and instrumentality shown in the drawings.

As used herein, the terms "system," "unit," and "module" include a hardware and/or software system that operates to perform one or more functions. For example, a system, unit, or module may include electronic circuitry that includes and/or is coupled to one or more computer processors, controllers, or other logic based devices that perform operations based on instructions stored on a tangible and non-transitory computer readable storage medium, such as a computer memory. Alternatively or additionally, a system, unit, or module may include a hard-wired device that performs operations based on hard-wired logic of the device. The systems, units, or modules shown in the attached figures may represent the hardware that operates based on software or hardwired instructions, the software that directs hardware to perform the operations, or a combination thereof. "Systems," "units," or "modules" may include or represent hardware and associated instructions (e.g., software stored on a tangible and non-transitory computer readable storage medium, such as a computer hard drive, ROM, RAM, or the like) that perform one or more operations described herein. The hardware may include electronic circuits that include and/or are connected to one or more logic-based devices, such as microprocessors, processors, controllers, or the like. These devices may be off-the-shelf devices that are appropriately programmed or instructed to perform operations described herein from the instructions described herein. Additionally or alternatively, one or more of these devices may be hard-wired with logic circuits to perform these operations. Further, "systems," "units," or "modules" may be configured to execute one or more algorithms to perform functions or operations described herein. The one or more algorithms may include aspects of embodiments disclosed herein, whether or not expressly identified in a flowchart or as a step of a method.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Also as used herein, the phrase "image" or similar terminology is not intended to exclude embodiments in which data representing an image is generated, but a viewable image is not. Therefore, as used herein the term "image" broadly refers to both viewable images and data representing a viewable image. However, certain embodiments generate, or are configured to generate, at least one viewable image.

Various embodiments provide an X-ray detector (e.g., a complementary metal oxide semiconductor (CMOS)-based X-ray detector) that is switchable between configurations for varying levels of saturation or radiation dose employed during an imaging procedure. For example, various embodiments provide a CMOS-based X-ray detector that has multiple selective light sensing areas. As used herein, "multiple selective" light sensing areas may be understood as plural light sensing areas that may be activated or otherwise combined in various combinations. For example, a first light sensing area may be employed by itself in a first mode of operation or configuration, while the first light sensing area and a second light sensing area may both be utilized in a second mode of operation or configuration. Thus, in the first mode of operation, only light received by the first light sensing area is used to generate electric charge (e.g., a current sent to a capacitor for storage of charge by the capacitor), whereas in the second mode of operation, light received by the first light sensing area and light received by the second light sensing area may be utilized to generate electric charge. In various embodiments, a detector may include an array or set of diodes having an available sensing area. A given configuration may include all or a subset of the diodes. The sensing area of a given configuration encompasses all or a subset of the total available sensing area, depending on which of total available diodes have been activated.

As used herein, "selectably configurable" light sensing areas (e.g., surface areas of diodes configured to convert received light to electric charge) may be understood as being controllably activated in various configurations. For example, one or more switches may be used to control which diodes are operably connected to provide current to other aspects of a pixel, such as capacitors for storing electric charge from diodes that have been selected. By selecting a configuration of light sensing areas (e.g., photodiodes) having a relatively larger area, more electric charge may be provided, for example to improve sensitivity in low radiation applications. By selecting a configuration of light sensing areas having a relatively smaller area, less electric charge may be provided, for example, to allow use of a smaller capacitor (or capacitors) to reduce electronic noise.

Alternatively or additionally, a CMOS-based X-ray detector in accordance with various embodiments may include multiple selective capacitors configured to store electric charge from the light sensing areas. Thus, an X-ray detector may include capacitors that are selectably configurable to provide a range of capacitance. Low capacitance combinations may be selected to reduce electronic noise for applications where a relatively low amount of charge will be provided. For example, a first capacitor may be employed by itself in a first mode of operation or configuration, while the first capacitor and a second capacitor may be both utilized in a second mode of operation or configuration. Thus, in the first mode of operation, only the first capacitor may be used to store charge (providing for lower electronic noise, but with lower storage capability), whereas in the second mode of operation, both the first and second capacitors may be used (resulting in more electronic noise, but providing improved storage capacity). In various embodiments, a configuration of an X-ray detector or light sensor may refer to a combination of capacitors that are selected for use in a given mode of operation, a combination of light sensing areas or diodes that are selected for use in a given mode of operation, or a combination of capacitors and diodes that are selected for use in a given mode of operation.

Thus, in various embodiments, a pixel includes a diode assembly having plural photodiodes selectably configurable to provide various combinations of overall surface area, and also includes a capacitor assembly having plural capacitors selectably configurable to provide various combinations of overall capacitance to store charge from the diode assembly. In one example scenario, a relatively low amount of radiation dosage (e.g., nominally 1 µR/frame) may be used as part of an imaging process. For a low amount of radiation, a relatively low amount of light energy may be provided from the diode assembly, and a relatively low amount of storage may be required of the capacitor assembly. Accordingly, for a first mode of operation corresponding to a lower radiation dosage, a first combination or configuration of diodes may be selected that utilizes all or most of the available sensing area to provide improved sensitivity, and a first combination or configuration of capacitors may be selected that utilizes a relatively low number of capacitors or overall capacitance to provided reduced electronic noise while storing the relatively low amount of charge. A second mode of operation may correspond to a relatively high amount of radiation dosage (e.g., nominally 1000 µR/frame). For a relatively high amount of radiation, a relatively high amount of charge may be provided from the diode assembly. The high amount of charge may be too much for a capacitor combination having a relatively low capacitance (e.g., the capacitor combination of the first mode of operation). Accordingly, a capacitor combination including more capacitors to provide a higher overall capacitance may be selected, and/or a diode combination reducing the surface area of the diode assembly (e.g., selecting fewer diodes than the first mode of operation) may be selected to reduce the amount of charge provided to the capacitor assembly. Thus, in the second mode of operation, a second configuration of diodes may be selected that utilizes a relatively lower amount of the available surface area, and a second configuration of capacitors may be selected that uses all or most of the available capacitors. By varying the surface area of the diodes selected and/or varying the capacitors selected, intermediate configurations may be selected for intermediate ranges of radiation dosage. In some embodiments, one or more modes of operation for intermediate ranges of radiation dosage may also be employed.

Thus, by controlling the fraction of available light converted by a diode combination to provide charge, and/or by controlling the amount of total capacitance that is available to store the charge, a single detector may be employed providing for reduced electronic noise (e.g., when used with a low radiation dosage) and also employing adequate capacitance for use in conjunction with higher radiation dosage. Various embodiments therefore provide a single detector having multiple diode and/or capacitor combinations or configurations, so that the detector may be effectively and reliably used with a relatively wide range of radiation dosages or levels. By using a single detector, for example, total cost for detectors may be reduced (as total cost is proportional to the number of detectors).

A technical effect of at least some embodiments provides a single detector that may be used for a variety of radiation dose levels. A technical effect of at least some embodiments includes reduction in detector price (e.g., by allowing use of fewer detectors). A technical effect of at least some embodiments provides reduced electronic noise for imaging procedures. A technical effect of at least some embodiments provides improved cost, convenience, and/or reliability of imaging procedures.

FIG. 1 provides a schematic diagram of an imaging system 100 in accordance with various embodiments. The imaging system 100 includes an X-ray source 110, a scintillator 120, a light sensor 130, a processing unit 150, an input unit 160, and an output unit 170. In the illustrated embodiment, the scintillator 120 and the light sensor 130 form an X-ray detector. It may be noted that one or more the various components or units of FIG. 1, although depicted as physically separate units or components, may in various embodiments be configured as more than one component or unit and/or be combined with another component or unit. For example, the light sensor 130 and one or more aspects of the processing unit 150 may be configured as a single unit. As another example, the input unit 160 and/or output unit 170 may be configured as a single unit with one or more aspects of the processing unit 150.

Generally, in the illustrated embodiment, the imaging system 100 may be used to provide an image (e.g., an X-ray image) of the object 108. The object 108, for example, may be a portion of a human or animal patient. The X-ray source 110 in the illustrated embodiment emits X-rays 102 that pass through the object 108 and are attenuated by the object 108 (e.g., tissue within the object), with attenuated X-rays 104 passing from the object 108 to the scintillator 120. The X-rays 102 are attenuated differently during passage through the object 108, for example, depending on the type of anatomy or structure that a particular X-ray passes through, with the attenuated X-rays 104 used to reconstruct an image of the object 108 (or portion thereof). The scintillator 120 produces light photons 106 responsive to the impact of X-rays 104 upon the scintillator. The light photons 106 from the scintillator 120 impact the light sensor 130. The light sensor 130 is configured to produce electric charge responsive to the impingement of light photons 106 from the scintillator upon a light reception surface 134 of the light sensor 130. The electric charge generated responsive to the reception of light may be stored and used to determine the amount of light impinging upon a given portion of the light sensor 130, such as one or more pixels. The amount of light impacting a given portion of the light sensor 130 may be measured (e.g., by the processing module 150), and used to assign a color or shade to a portion of an image corresponding to the portion of the light sensor 130.

The X-ray source 110 is configured to provide X-rays that pass through the object 108 and are used to provide an image of the object 108 (or a portion thereof). In various embodiments, the X-ray source 110 may be configured as an X-ray tube that emits X-rays over a field of view from a focal point, with the field of view including at least a portion of the object 108. The X-ray source 110 and/or an associated filter (not shown) may be configured to provide X-rays having a double-peaked energy spectra, allowing for high and low energy X-rays to be separately identified and used, for example, in connection with a material decomposition analysis. Further, the X-ray source 110 may be configured to provide variable dosages or amounts of X-rays. For example, some imaging procedures may not require high dosages, and a lower dosage may be utilized to minimize or reduce exposure to radiation. For other imaging procedures, such as a procedure requiring higher signal to noise ratio or procedures involving x-ray penetration through relatively large amounts of tissue (such as for obese patients), higher dosages may be utilized. In some embodiments, the X-ray source 110 may be configured to provide saturation exposures at the detector surface between about 50 µR/frame and about 5000 µR/frame (or 5 mR/frame).

The scintillator 120 is configured to receive the attenuated X-rays 104 and to emit light photons 106 responsive to reception of the attenuated X-rays 104. In various embodiments, plural light photons may be produced for each X-ray photon that impacts the scintillator 120. For example, in some embodiments, about 2000 light photons may be produced for each X-ray that impacts the scintillator 120. It may be noted that in the schematic depiction of FIG. 1 the scintillator 120 is shown at a distance from the light sensor 130; however, the scintillator 120 and light sensor 130 may be joined in various embodiments. In the illustrated embodiment, the scintillator 120 includes an X-ray reception surface 122 and a light emission surface 124. The X-ray reception surface 122 is oriented toward the object 108 and toward the X-ray source 110, and the light emission surface 124 is oriented toward the light sensor 130. Generally, in various embodiments, after an X-ray impacts the X-ray reception surface 122, light photons are emitted from a corresponding portion (e.g., directly beneath the portion impacted by the X-ray) of the light emission surface 124 to the light sensor 130.

The light sensor 130 is configured to receive the light photons 106 from the scintillator 120, convert received light photons to electric charge, and store the electric charge. The light energy may be converted and stored for specific portions of the light sensor that receive the energy (e.g., pixels), and the stored charge used to provide a measure of the x-ray radiation received by the detector on a per pixel basis. In some embodiments, pixels may be read row by row in an iterative process and the signal converted to a digital value. A shade or color may be assigned for each pixel (e.g., a portion of an image corresponding to each pixel) based on the digital signal value for the pixel and used to reconstruct an image.

A top view of the light sensor 130 is seen in the top center of FIG. 1. The depicted light sensor 130 includes an array or grid 131 of pixels 132 having a light reception surface 134 oriented toward the scintillator 120 and configured to receive light from the scintillator 120. The grid 131 of pixels 132 is arranged in columns 136 and rows 138. Because the pixels 132 receive light photons from particular portions of the scintillator 120 based on the impingement of X-ray photons on particular portions of the scintillator 120, the pixels 132 may be understood as indirectly receiving or detecting the X-rays. The pixels 132 of the light sensor 130 may be configured as integrated circuits (ICs). In various embodiments, the pixels 132 may be formed using CMOS techniques. Forming the pixels 132 as CMOS devices provides for inclusion of plural components (e.g., photodiodes, transistors, capacitors, or the like) for each pixel. A CMOS pixel may include more components than, for example, an amorphous silicon pixel. CMOS pixels may include plural components on a relatively small pixel size, such as about two hundred microns by about two hundred microns. In the illustrated embodiment, a relatively small numbers of pixels 132 are shown, as the depicted light sensor 130 includes 36 pixels 132 arranged in a generally square 6×6 grid 131. It should be noted that other numbers of pixels and/or configurations may be employed in alternate embodiments. For example, in some embodiments, a grid of 1536×1536 pixels may be used for a detector having a surface area of about 31 centimeters by about 31 centimeters, resulting in a total of about 2.36 million pixels.

As seen in the schematic view of an individual pixel 132 on the right hand side of FIG. 1, the individual pixel 132 includes a diode assembly 140, a capacitor assembly 142, and a control assembly 144. Generally, the diode assembly 140 is configured to convert light energy received from the scintillator 120 to electric charge, and the capacitor assembly 142 is configured to store electric charge generated by the diode assembly 140. The control assembly 144 is configured to control one or both of the diode assembly 140 or the capacitor assembly 142, for example to select individual diodes and/or capacitors for inclusion in a configuration of the pixel 132 to be employed for a given radiation dosage.

In various embodiments, the diode assembly 140 may include plural photodiodes configured to convert light received at the light reception surface 134 into electric charge. The plural diodes may be selectably configurable in plural combinations. For example, one or more diodes may be operably connected via a corresponding switch to a circuit configured to store a charge provided by the diode assembly 140. By setting a switch to allow electric charge from a given diode to flow to the circuit, the given diode may be selected or used as part of a combination. By setting a switch to prevent or inhibit electric charge from flowing from a particular diode to the circuit, the particular diode may not be selected or not used, or may be de-selected from a combination. Thus, one or more of the diodes may be used in one configuration or combination, while a different arrangement of one or more of the diodes may be used in a different configuration or combination. The total amount of charge provided per amount of light impacting the light receiving surface of a given pixel may therefore be controlled by selecting different combinations of diodes. Generally, combinations that include a higher proportion of the available surface area may provide more charge (providing higher sensitivity, and requiring a larger capacitor to hold the charge), while combinations that include a lower proportion of the available surface area may provide less charge (providing lower sensitivity, but allowing use of a smaller capacitor or lower capacitance, thereby reducing electronic noise).

Generally, the capacitor assembly 142 is configured to receive and store electric charge from the diode assembly 140. The stored charge may be converted to a digital value used to reconstruct an image. The capacitor assembly 142 may include plural capacitors. Each capacitor may be formed, for example, in a CMOS device. The plural capacitors may be selectably configurable in plural combinations. For example, one or more capacitors may be operably connected via a switch to a circuit providing a charge from the diode assembly 140. By setting a switch to allow electric charge from the diode assembly 140 to flow to a given capacitor, the given capacitor may be selected or used as part of a combination. By setting a switch to prevent or inhibit electric charge from flowing from the diode assembly 140 to the particular capacitor, the particular capacitor may not be selected or not used, or may be de-selected from a combination. Thus, one or more of the capacitors may be used in one configuration or combination, while a different arrangement of one or more of the capacitors may be used in a different configuration or combination. The total amount of capacitance or storage available may therefore be controlled by selecting different combinations of capacitors. Generally, combinations that provide a higher capacitance provide increased storage capability for higher radiation dosage applications, while combinations that provide a lower capacitance have lower storage capability, but reduced electronic noise.

The depicted control assembly 144 in the illustrated embodiment is operably connected to the diode assembly 140 and the capacitor assembly 142, and configured to control which diodes of the diode assembly 140 and which capacitors of the capacitor assembly 142 are selected to provide a configuration or combination of diodes and capacitors appropriate for a given application. A combination of diodes and capacitors may be understood as appropriate for or configured for an imaging application when the combination provides adequate, usable, or otherwise desirable sensitivity performance while maintaining electronic noise at a minimum or otherwise desirable level. For example, a combination that does not yield enough capacitance to store the charge supplied in a high dosage application is not appropriate, or is not configured for such an application. As another example, a combination that provides substantially more capacitance than necessary (e.g., more capacitance than other available combinations that provide enough capacitance for the application) for a low dosage application may be understood as not appropriate for or not configured for such an application, as such a combination may result in an undesirable amount of unnecessary electronic noise. However, a combination that provides adequate capacitance while minimizing or reducing electronic noise may be understood as appropriate for or configured a given imaging application.

In various embodiments, the control assembly 144 may include one or more switches operably connected to one or more capacitors and/or diodes. By controlling the states of one or more switches, different combinations of diodes and/or capacitors may be employed. It should be noted that the control assembly 144 is depicted schematically as a separate block in FIG. 1; however, one or more aspects of the control assembly 144 may be physically located with the diode assembly 140 or the capacitor assembly 142. For example, the control assembly 144 may include plural switches, some of which are physically disposed among diodes to which the switches control the flow of current to or from, while other of the switches may be physically disposed among capacitors to which the switches control the flow of current to or from. In various embodiments, the switches may be configured as transistors formed as part of a CMOS forming process. It may be noted that one or more diodes or capacitors may not have a dedicated switch associated therewith. For example, one diode may be configured as a base diode that is used in all configurations or combinations, while one or more other diodes are selectably addable to or removable from a circuit via a switch to provide different configurations or combinations. Use of such a base diode may reduce the number of switches required, preserving space. For additional details regarding example circuits using selectably configurable capacitors and/or diodes, see FIGS. 2-4 and related discussion.

Returning to FIG. 1, the depicted processing unit 150 is configured to receive an input corresponding to a radiation dosage, identify an appropriate detector configuration, and implement the identified appropriate configuration. For example, the processing unit 150 may be configured to receive an input corresponding to an upcoming imaging procedure, determine a radiation dosage associated with the upcoming procedure, determine a configuration for the diodes and/or capacitors of one or more pixels 132 to be used for the upcoming procedure, and to control the one or more pixels to implement the determined configuration. In various embodiments, the processing unit 150 may control one or more switches to connect or select the determined configuration of diodes and/or capacitors for each pixel 132 of the light sensor 130. Further, the processing unit 150 may be employed during the acquisition of imaging data and/or during image reconstruction. For example, the processing unit 150 may be configured to use the signal recorded for each pixel to reconstruct an image. In the illustrated embodiment, the processing unit 150 includes a reading module 152, a selection module 154, and a memory 156. The memory 156 may include a tangible and non-transitory computer readable medium and be operably connected to the reading module 152, selection module 154, and/or other aspects or portions of the processing unit 150. It may be noted that the particular number and arrangement of processing units and modules shown in FIG. 1 is for illustrative purposes, and that other arrangements may be employed in other embodiments.

Generally, in various embodiments, the processing unit 150 (and/or any sub-unit or module of the processing unit 150) may be understood as a processing circuitry unit and may include processing circuitry such as one or more field programmable gate array (FPGA), application specific integrated circuit (ASIC), integrated circuit (IC), or microprocessor. The processing unit 150 in various embodiments may be configured to execute one or more algorithms to perform functions or operations described herein. The one or more algorithms may include aspects of embodiments disclosed herein, whether or not expressly identified in a flowchart or as a step of a method.

The depicted selection module 154 is configured to identify or determine radiation dosage for an upcoming imaging procedure based on a received input. For example, an operator may provide an input via the input module 160 describing a procedure to be performed (e.g., type of procedure, imaging parameters, patient description (for example, patient size)), and the selection module 154 may determine a radiation dosage expected for the imaging procedure. In various embodiments, radiation dosages may be tabulated for various imaging procedures in a database accessible to the selection module (e.g., a database stored in the memory 156). As another example, an operator may directly enter (e.g., via a keyboard, touchscreen, or the like) a value of radiation dosage to be used in an upcoming procedure. As one more example, a control unit or other aspect of the X-ray source 110 and/or other imaging equipment may provide information to the selection module 154 corresponding to a radiation dosage for an upcoming procedure to be performed using the X-ray source 110 and/or other imaging equipment.

In the illustrated embodiment, the selection module 154 is also configured to identify an appropriate detector configuration for the identified or determined radiation dosage. The detector configuration may include a combination of diodes of the diode assembly 140 and a combination of capacitors of the capacitor assembly 142. For example, various detector configurations may be tabulated for various ranges of radiation dosage in a database accessible to the selection module 154. To implement the determined or selected configuration, the selection module 154 may send control signals to the light sensor 130 to set the state of switches associated with diodes and/or capacitors of the pixels 132. For example, switches of diodes and/or capacitors to be included or selected for the determined configuration may be set to an "on" position allowing the passage of current, and switches for diodes and/or capacitors not to be included or not to be selected for the determined configuration may be set in an "off" position preventing or inhibiting the flow of current.

In the illustrated embodiment, the reading module 152 is configured to read and record the signal measured in each pixel 132 following an exposure. For example, each pixel 132 may be configured to provide an output voltage representative of the amount of x-ray energy impacting that particular pixel. In various embodiments, light energy from x-ray photons impacting the scintillator may be converted to electric charge by the diode assembly 140 of the pixel, with the capacitor assembly 142 storing the charge. The recorded signal for each pixel 132 may be used to reconstruct an image. For example, the reading module 152 may provide a measured signal for each pixel to another aspect of the processing unit 150 and/or an image generation processing unit for reconstruction of the image.

The depicted input unit 160 is operably connected to the processing unit 150, and is configured to provide information or data used by the processing unit 150 in configuring the pixels 132 of the light sensor 130. The input unit 160 may provide a keyboard, touchscreen, or the like configured to allow an operator to provide information to the processing unit 150. For example, an operator may identify an imaging process to be performed and/or information regarding a patient on whom a procedure is to be performed via the input unit 160, and the processing unit 150 may use the provided information to determine an expected radiation dosage and appropriate configuration for the light sensor 130. As another example, an operator may use the input unit 160 to directly input a radiation dosage. In some embodiments, an operator may input a value of expected radiation dosage, while in other embodiments, an operator may input a description of the expected radiation dosage, such as "high," "medium," or "low," among others. Additionally or alternatively, the input unit 160 may include a data port configured to receive information from other processing units of an imaging system. It may be noted that the input unit 160 and output unit 170 are depicted as separate blocks in FIG. 1, but may be part of a combined physical unit in various embodiments. For example, in some embodiments, the processing unit 150 may include a touch screen that is utilized as an input unit and as an output unit.

In the illustrated embodiment, the output unit 170 is operably connected to the processing unit 150 and configured to receive an output of the processing unit. For example, the output unit 170 may be configured to display an image of the object being examined using information from the output unit 170 (e.g., measured signals for each pixel, or a reconstructed image based on measured signals for each pixel). The output unit 170 may also provide a display for use in providing information to the processing unit 150. For example, the output unit 170 may display, to an operator entering information via the input unit 160, information corresponding to available imaging procedures, radiation dosages for imaging procedures, sensitivity levels corresponding to detector configurations, or the like. The output unit 170 may also be configured to provide information from the processing unit 150 to additional systems or modules. As one example, the output unit 170 may provide imaging information (e.g., measured signal per pixel) to an image reconstruction system. As another example, the output unit 170 may provide imaging information and/or reconstructed images to a patient information system configured to store imaging results for patients.

Figure 2:
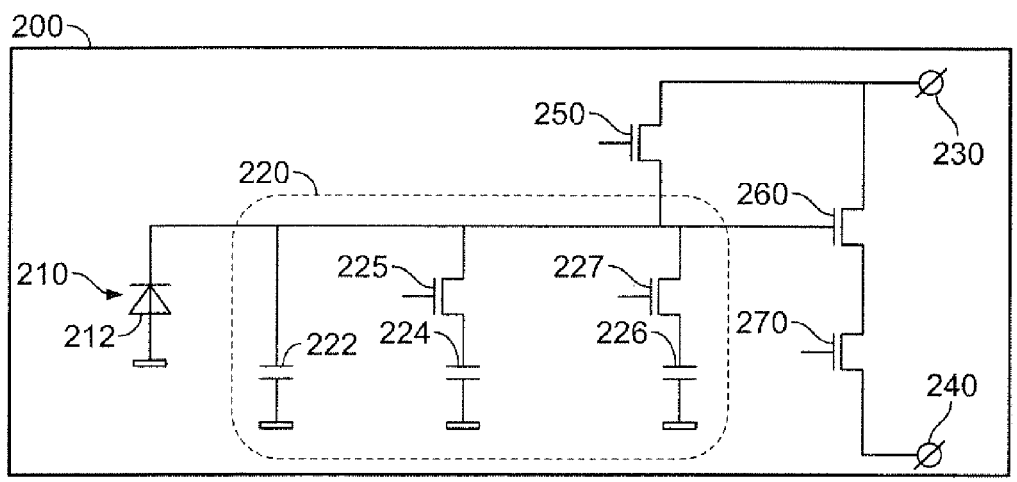
FIG. 2 is a circuit diagram of a pixel of a detector in accordance with various embodiments.

As discussed herein in connection with FIG. 1, in various embodiments, a light sensing area of photodiodes of a pixel and/or a total capacitance of capacitors of a pixel may be selectably adjustable for a variety of radiation dosage levels, for example to reduce electronic noise while still providing adequate storage for a given dosage level or range of dosage levels. FIG. 2 is a circuit diagram of a pixel circuit 200 of a light sensor including selectably configurable capacitors. The circuit diagram shown in FIG. 2 may be used in certain conventional systems. The pixel circuit 200 includes a diode assembly 210, a capacitor assembly 220, a reference voltage 230, an output voltage 240, a reset component 250, a source follower 260, and a selector 270. (For examples of circuits including selectably configurable diodes, see FIGS. 3 and 4.) Generally, the diode assembly 210 includes one or more photodiodes configured to receive light from a scintillator (e.g., scintillator 120), and produce electric charge responsive to receipt of the light from the scintillator. The capacitor assembly 220 is configured to collect and store electric charge produced by the diode assembly 210. When the capacitor assembly 220 has a stored charge indicative of or corresponding to the impingement of light energy (e.g., an amount of light energy produced by the scintillator responsive to X-ray photons) upon the diode assembly 210, the selector 270 is configured to provide an output voltage 240 that may be used to determine the amount of x-ray impingement for the pixel. In various embodiments, the various components or aspects of the pixel circuit 200 may be fanned in electric communication with each other as part of a CMOS forming process used to construct the pixel.

The depicted diode assembly 210 includes a pinned photodiode 212. The pinned photodiode 212 includes a surface area disposed on a light reception surface (e.g., light reception surface 134) that receives light (e.g., light photons) from the scintillator 120, and, responsive to the reception of light, provides current to the rest of the pixel circuit 200. Thus, an electric charge in the pixel circuit 200 may be used to indicate how much light has impacted a pixel on which the surface area of the pinned photodiode 212 is disposed during an imaging cycle. The electric charge may be stored by the capacitor assembly 220. It should be noted that in other embodiments, the diode assembly 210 may include plural diodes selectably configurable in various combinations or configurations, as may be seen in FIGS. 3 and 4 and the related discussion.

Returning to FIG. 2, the capacitor assembly 220 is configured to store electric charge from the diode assembly 210. The depicted capacitor assembly 220 includes a first capacitor 222, a second capacitor 224, a second capacitor switch 225, a third capacitor 226, and a third capacitor switch 227. The second capacitor switch 225 is configured to control the flow of charge from the diode assembly 210 to the second capacitor 224, and the third capacitor switch 227 is configured to control the flow of charge from the diode assembly 210 to the third capacitor 226. Generally, the states of the switches are set to select a given capacitor or capacitors for a given configuration based on charge required to be stored, with more capacitors used when more charge will be present (e.g., high radiation dosage applications) to provide increased storage, and with fewer capacitors used when less charge will be present (e.g., low radiation dosage applications) to reduce electronic noise. To minimize or reduce noise, the lowest available capacitance sufficient to store the charge from the diode assembly 210 for a given imaging application may be employed.

As described herein, a capacitor may be understood as activated, selected, used, or employed for a given configuration or combination when the current or electric charge from one or more photodiodes (e.g., pinned photodiode 212) of a diode assembly (e.g. diode assembly 210) is permitted to flow through the capacitor, with the capacitor storing electric charge from the diode. A capacitor may be understood as not selected, not activated, not used, or not employed when the charge from a diode assembly that is allowed to flow to other capacitors is prohibited or inhibited from flowing to the given capacitor.

In FIG. 2, the first capacitor 222 is connected via a solid conductor line to the diode 212. Thus, any charge from the diode 212 will flow to the first capacitor in any configuration, and the first capacitor 222 may be understood as permanently selected or activated, or selected or activated for all configurations of the pixel circuit 200. Further, the first capacitor 222 may be understood as a base capacitor providing a base or minimum capacitance of the capacitor assembly 220, with other capacitors optionally selectable to add capacitance. In the illustrated embodiment, the second capacitor 224 is selected when the second capacitor switch 225 is in an "on" state or permitting current to flow from the diode assembly 210 to the second capacitor 224, and not selected when the second capacitor switch 225 is in an "off" state or preventing or inhibiting the flow of current. Similarly, the third capacitor 226 is selected when the third capacitor switch 227 is in an "on" state, and not selected when the third capacitor switch 227 is in an "off" state. Thus, the capacitor assembly 220 is selectably configurable in plural combinations. For example, a first configuration or combination including only the first capacitor 222 may be achieved by setting the second capacitor switch 225 and the third capacitor switch 227 in an "off" position. A second configuration or combination including the first capacitor 222 and the second capacitor 224 may be achieved by setting the second capacitor switch 225 in an "on" position and setting the third capacitor switch 227 in an "off" position. A third configuration or combination including the first capacitor 222, the second capacitor 224, and the third capacitor 226 may be achieved by setting the second capacitor switch 225 and the third capacitor switch 227 in an "on" position.

In one example scenario, a detector may be configured for three modes of operation. The first mode of operation may be for a fluoroscopic application, in which an image may be displayed on a screen but need not be saved. The expected maximum radiation exposure for the first mode of operation may be about 50 μR/frame, and the pixel circuit 200 may be placed in the first configuration (e.g., using the first capacitor 222 only) for the first mode of operation. The second mode of operation may be for a surgical or cine application, in which a sequence of images of higher signal to noise ratio or quality than the first mode of operation may be obtained and saved. The maximum exposure for the second mode of operation may be about 500 μR/frame, and the pixel circuit 200 may be placed in the second configuration (e.g., using the first capacitor 222 and the second capacitor 224, but not the third capacitor 226) for the second mode of operation. Adding additional capacitance as radiation levels increases may increase electronic noise. However, since x-ray quantum noise is higher for higher radiation doses, the total image noise may be dominated by the quantum noise and the additional electronic noise may be tolerable. The third mode of operation may be for an interventional application where even higher signal to noise ratio or image quality is desired. The maximum exposure for the third mode of operation may be about 5000 μR/frame, and the pixel circuit 200 may be placed in the third configuration (e.g, using the first capacitor 222, the second capacitor 224, and the third capacitor 226) for the third mode of operation.

Thus, a ratio of radiation dosage for the three modes of operation may be about 1:10:100, with the values of capacitance for the capacitors selected to provide a corresponding capacitance ratio for the first, second, and third configurations of the diode assembly 220 of 1:10:100, where the total capacitance in a second configuration is about ten times the capacitance in a first configuration, and where the total capacitance in a third configuration is about ten times the capacitance in the second configuration (or about 100 times the capacitance in the first configuration). For example, in an embodiment having a pixel size of about 200 μm×200 μm, the capacitors may be configured so that the first configuration has a capacitance of about 0.02 picoFarad (pF), the second configuration has a capacitance of about 0.2 pF, and the third configuration has a capacitance of about 2.0 pF. It may be noted that the above example is provided for illustrative purposes, and that other values of capacitance, other ratios of capacitance between modes of operation, other numbers of modes of operation, and other numbers of configurations may be employed in various embodiments.

The pixel circuit 200 is configured to provide an output indicating the level of radiation impinging on a pixel during an imaging cycle. In the illustrated embodiment, the pixel circuit 200 provides a voltage that may be read to determine the level of radiation. As indicated above, in addition to the diode assembly 210 and the capacitor assembly 220, the pixel circuit 200 includes a reference voltage 230, an output voltage 240, a reset component 250, a source follower 260, and a selector 270, as shown in FIG. 2.

The output voltage 240 is configured to provide an output (e.g., an output voltage) representative of the amount of light produced in the scintillator by x-ray exposure at that pixel during a given imaging cycle.

The reset component 250 (e.g., a transistor formed during a CMOS forming process and configured as a reset gate) is configured to reset the pixel circuit 200 to clear charge from the capacitor assembly 220 after the pixel circuit 200 has been read. For example, the reset component 250 may include a transistor configured to act as a switch. When the switch is turned on (e.g., after the signal from a pixel is read), the charge in the capacitor assembly 220 may be cleared.

The source follower 260, which may be configured, for example, as a transistor configured to act as an amplifier, is configured to allow charge from the capacitor assembly 220 to be read without removing the accumulated charge. The select component 270 (e.g., a selection gate) may be configured as a transistor configured to act as a switch. The switch is turned on when the capacitor assembly 220 holds a charge to be measured, and the voltage output 240 is sensed to determine the amount of charge. After the amount of charge is measured, the reset component 250 may be utilized to clear the charge from the capacitor assembly 220, thereby readying the pixel circuit 200 for the next imaging cycle. The measured charge for each pixel may be used to assign a color or shade used for a corresponding portion of an image (e.g., a corresponding pixel of the image).

Figure 3:
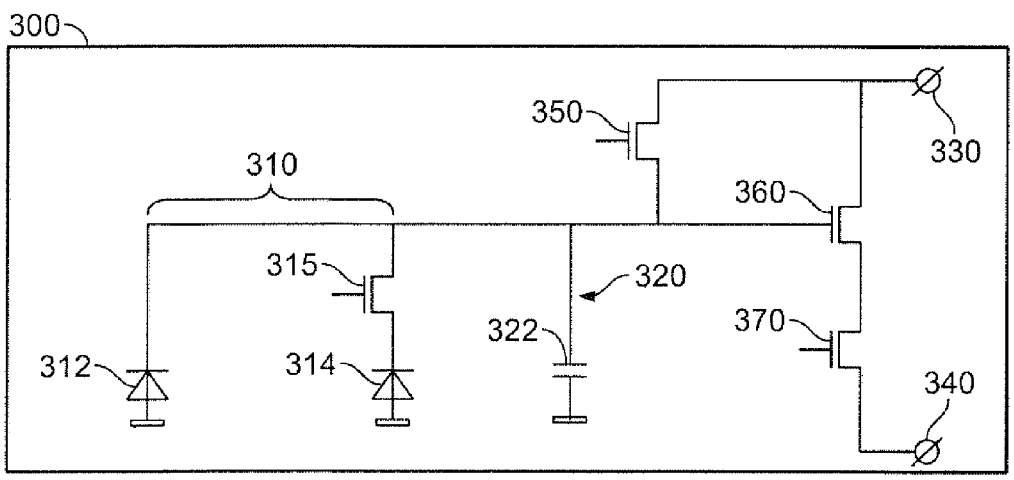
FIG. 3 is a circuit diagram of a pixel of a detector in accordance with various embodiments.
Figure 4:
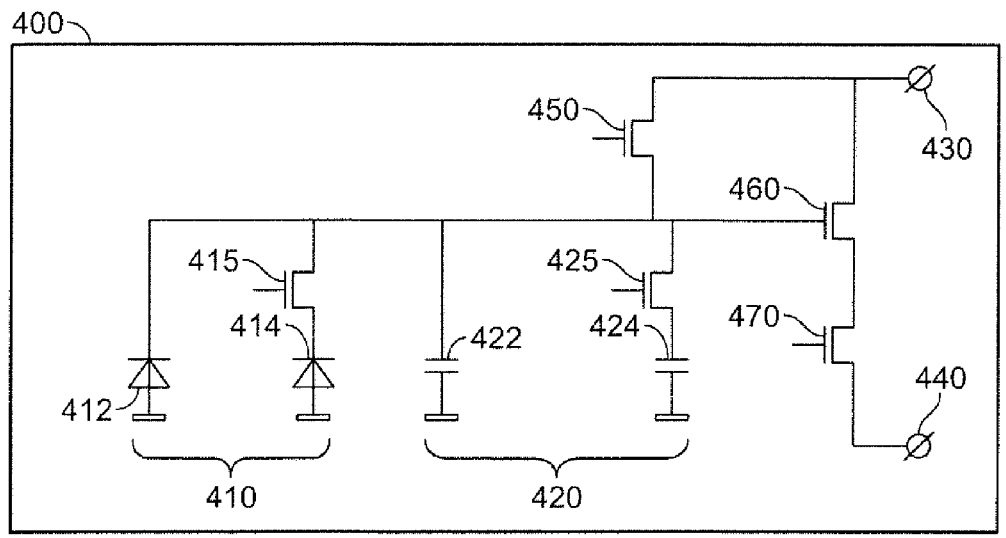
FIG. 4 is a circuit diagram of a pixel of a detector in accordance with various embodiments.

It may be noted that, due to space considerations, it may not be practical in some applications to provide configurations for a desired range of radiation dosages by varying the capacitance alone. For example, the ratio achieved by the embodiment of FIG. 2 may use a third capacitor 226 that has about 100 times more capacitance than the first capacitor 222. However, such a difference in capacitance between the smallest and largest capacitors may be difficult to obtain. For example, in some embodiments, it may be difficult or impractical to obtain a ratio of capacitance between the largest capacitor and the smallest capacitor of more than about 20:1. Further, including enough capacitors to achieve a ratio substantially greater than 20:1 may take up more space than desirable in a pixel. Thus, in some embodiments, the amount of charge produced by a diode assembly responsive to light received may be controlled additionally or alternatively to controlling the total capacitance of a capacitor assembly, to provide a greater range of radiation dosages with which a detector may be used while reducing the number of different capacitors required and/or a required range of total capacitance of the capacitor assemblies of the pixels. The amount of charge produced by a diode assembly based on a given amount of received light may be controlled, for example, by varying a surface area of photodiodes that convert the light to electric charge. For example, plural diodes may be selectably configurable in different combinations to provide different surface areas for converting light energy to electric charge. Generally, the more surface area a combination of photodiodes provides, the more electric charge will be produced from a given amount of light striking the pixel. Similarly, the less surface area a combination of photodiodes provides, the less electric charge will be produced from a given amount of light striking the pixel. Examples of circuits including plural diodes that are selectably configurable are shown in FIGS. 3 and 4. FIG. 3 provides an example of a circuit with a constant capacitance and variable photodiode configurations, and FIG. 4 provides an example of a circuit with variable photodiode configurations as well as variable capacitor configurations.

FIG. 3 is a circuit diagram of a pixel circuit 300 of a detector including selectably configurable photodiodes. The pixel circuit 300 includes a diode assembly 310, a capacitor assembly 320, a reference voltage 330, an output voltage 340, a reset component 350, a source follower 360, and a selector 370. Generally, the diode assembly 310 includes photodiodes configured to receive light from a scintillator (e.g., scintillator 120), and produce electric charge responsive to receipt of the light from the scintillator. The capacitor assembly 320 is configured to collect and store electric charge produced by the diode assembly 310. As similarly mentioned in connection with FIG. 2, when the capacitor assembly 320 has a stored charge indicative of or corresponding to the impingement of light energy upon the diode assembly 310, the selector 370 is configured to provide an output voltage 340 that may be used to measure the amount of light impinging on the pixel. Also similar to the pixel circuit 200, in various embodiments, the various components or aspects of the pixel circuit 300 may be fowled in electric communication with each other as part of a CMOS forming process used to construct the pixel. Further, the reference voltage 330, output voltage 340, reset component 350, source follower 360, and selector 370 may be configured generally similarly to the reference voltage 230, output voltage 240, reset component 250, source follower 260, and selector 270 of the pixel circuit 200.

The depicted diode assembly 310 includes a first photodiode 312, a second photodiode 314, and a second photodiode switch 315. Each of the photodiodes includes a surface area disposed on a light reception surface (e.g., light reception surface 134) that receives light from a scintillator (e.g., scintillator 120), and, responsive to the reception of light, provides current to the rest of the pixel circuit 300, including the capacitor assembly 320. Thus, an electric charge in the pixel circuit 300 may be used to indicate how much light has impacted a pixel on which the surface area of the diode assembly 310 is disposed during an imaging cycle. The electric charge may be stored by the capacitor assembly 320. It should be noted that in the illustrated embodiment the diode assembly 310 includes two photodiodes; however, different numbers of photodiodes may be employed in various embodiments.

The relative sizes of the surface areas of the first photodiode 312 and the second photodiode 314 may be selected to provide a desired level of variability between configurations of the detector. For example, in various embodiments, a first configuration may include the first photodiode 312 but not the second photodiode 314, and a second configuration may include the first photodiode 312 and the second photodiode. Thus, the surface area of the first configuration includes only the surface area of the first photodiode 312, while the surface area of the second configuration includes the surface areas of both the first photodiode 312 and the second photodiode 314. In some embodiments, the surface area of the first photodiode 312 may be about 1/9 of the surface area of the second photodiode. Thus, the first configuration provides about 1/10 of the surface area of the second configuration. Accordingly, when the detector is in the first configuration, a given pixel may be configured to receive about ten times more light than when in the second configuration, if the total capacitance is the same for the first and second configurations.

Thus, the pixel circuit 300 may be configured, in the first configuration, for a first radiation dosage that is about ten times more than a second radiation dosage for which the pixel circuit 300 is configured in the second configuration. In some embodiments, the second photodiode 314 may include a surface area including a perimeter, with the surface area of the first photodiode 312 distributed within the perimeter. Examples of photodiode surface area arrangements may be seen in FIGS. 5-10. In various embodiments, the surface area of the first diode 312 may be generally uniformly distributed within the surface area of the second diode 314. The surface area of a first diode may be understood as uniformly distributed within the surface area of a second diode when a proportion of light striking the first and second diodes relative to each other remains generally constant over the light reception surface of the pixel. For example, in some embodiments, the proportion of light striking the first diode may vary about 10% from a maximum proportion to a minimum proportion based on where an X-ray photon strikes a corresponding portion of a scintillator within a pixel area. As another example, the proportion of light striking the first diode may vary about 20% from a maximum proportion to a minimum proportion based on where an x-ray strikes within the pixel area. As a relatively large number of light photons are produced by each impact of an X-ray photon on a scintillator, the surface area of the first diode need not necessarily extend to the edge of the surface area of the second diode.

The second photodiode switch 315 is configured to provide selection or de-selection of the second photodiode 314. The second photodiode switch 315 is configured to control the flow of current or charge from the second photodiode 314 of the diode assembly 310 to the capacitor assembly 320. The second photodiode switch 315 may be configured as a transistor configured to operate as a switch based on control signals transmitted from a processing unit (e.g., processing unit 150). Generally, the state of the second photodiode switch 315 may be set to select the second photodiode 314 for a given configuration based on the availability of capacitance relative to an expected amount of light, with the second photodiode 314 used when less light from the scintillator will be present (e.g., low radiation dosage applications) to provide better sensitivity or image quality, and the second photodiode 314 not used when more light from the scintillator will be present (e.g., high radiation dosage applications) to prevent providing more charge than can be handled by the available or selected capacitors.

As described herein, a photodiode may be understood as activated, selected, used, or employed for a given configuration or combination when the current or electric charge from the photodiode is permitted to flow from the diode assembly (e.g., diode assembly 310) to a capacitor assembly (e.g., capacitor assembly 320). A photodiode may be understood as not selected, not activated, not used, or not employed when the current or charge from the photodiode is prevented or inhibited from flowing from the diode assembly to the capacitor assembly.

In FIG. 3, the first photodiode 312 is connected via a solid conductor line to the capacitor assembly 320. Thus, any charge from the first photodiode 312 will flow to the capacitor assembly 320, and the first photodiode 312 may be understood as permanently selected or activated, or selected or activated for all configurations of the pixel circuit 300. Also, the first photodiode 312 may be understood as a base photodiode providing a base or minimum surface area of the diode assembly 310, with other photodiodes optionally selectable to add surface area. In the illustrated embodiment, the second photodiode 314 is selected when the second photodiode switch 315 is in an "on" state or permitting current to flow from the second photodiode 312 to the capacitor assembly 320, and not selected when the second photodiode switch 315 is in an "off" state or preventing or inhibiting the flow of current. Thus, the photodiode assembly 310 is selectably configurable in plural combinations. For example, a first configuration or combination including only the first photodiode 312 may be achieved by setting the second photodiode switch 315 in an "off" position. A second configuration or combination including the first photodiode 312 and the second photodiode 314 may be achieved by setting the second photodiode switch 315 in an "on" position.

The depicted capacitor assembly 320 includes a capacitor 322 and is configured to store electric charge from the diode assembly 310. In the illustrated embodiment, the capacitor assembly 320 only includes a single capacitor and has a fixed capacitance. However, in alternate embodiments, (for example, the pixel circuit 200 of FIG. 2 and the pixel circuit 400 of FIG. 4), a capacitor assembly may include plural capacitors that are selectably configurable to provide a range of different capacitances.

From above, in the pixel circuit 200 of FIG. 2, the surface area of the diode assembly 210 remains fixed, while the capacitor assembly 220 is configured to provide a range of capacitances for different radiation levels or dosages. In the pixel circuit 300 of FIG. 3, the capacitance of the capacitor assembly 320 remains fixed, while the surface area of the diode assembly 310 is configure to provide a range of surface areas for different radiation levels or dosages. In various embodiments, such as the embodiment depicted in FIG. 4, both the capacitance and surface area may be adjustable. In some embodiments, selectably configurable photodiodes and capacitors may provide flexibility for a wide range of radiation dosages while still fitting within size constraints imposed by pixel size.

FIG. 4 is a circuit diagram of a pixel circuit 400 of a detector including selectably configurable photodiodes and selectably configurable capacitors. The pixel circuit 400 includes a diode assembly 410, a capacitor assembly 420, a reference voltage 430, an output voltage 440, a reset component 450, a source follower 460, and a selector 470. Generally, the diode assembly 410 includes photodiodes configured to receive light from a scintillator (e.g., scintillator 120), and produce electric charge responsive to receipt of the light from the scintillator. The capacitor assembly 420 is configured to collect and store electric charge produced by the diode assembly 410. As similarly mentioned in connection with FIGS. 2 and 3, when the capacitor assembly 420 has a stored charge indicative of or corresponding to the impingement of light energy upon the diode assembly 410, the selector 470 is configured to provide an output voltage 440 that may be used to determine the amount of charge. Also similar to the pixel circuit 200 and the pixel circuit 300, in various embodiments, the various components or aspects of the pixel circuit 400 may be formed in electric communication with each other as part of a CMOS forming process used to construct the pixel. Further, the reference voltage 430, output voltage 440, reset component 450, source follower 460, and selector 470 may be configured generally similarly to the reference voltage 230, output voltage 240, reset component 250, source follower 260, and selector 270 of the pixel circuit 200.

The diode assembly 410 may be generally similar in respects to the diode assembly 310 discussed herein in connection with FIG. 3. For example, the diode assembly 410 includes a first photodiode 412, a second photodiode 414, and a second photodiode switch 415. The first photodiode 412 is configured as a base photodiode used in all configurations, while the second photodiode switch 415 is used to select or de-select the second photodiode 414. Each of the photodiodes includes a surface area disposed on a light reception surface (e.g., light reception surface 134) that receives light from a scintillator (e.g., scintillator 120), and, responsive to the reception of light, provides current or charge to the rest of the pixel circuit 400, including the capacitor assembly 420, which may store the electric charge. While the depicted diode assembly 410 includes two photodiodes, it may be noted that different numbers of photodiodes may be employed in various embodiments.

The relative sizes of the surface areas of the first photodiode 412 and the second photodiode 414 may be selected to provide a desired level of variability between configurations of the detector. In the illustrated embodiment, the surface area of the first photodiode 412 may be about 1/9 of the surface area of the second photodiode 414. Thus, the diode assembly 410 provides about 1/10 of the surface area (and about 1/10 of the charge) when only the first photodiode 412 is used compared to when the first photodiode 412 and the second photodiode 414 are used. Accordingly, a given pixel may be configured to receive about ten times more light when only the first photodiode 412 is used than when both photodiodes are used, if the total capacitance remains constant.

The capacitor assembly 420 may be generally similar in respect to the capacitor assembly 220 discussed herein in connection with FIG. 2. In FIG. 4, however, the depicted capacitor assembly 420 includes two capacitors instead of three as shown in FIG. 2. The capacitor assembly 420 includes a first capacitor 422, a second capacitor 424, and a second capacitor switch 425. The first capacitor 414 is configured as a base capacitor used in all configurations, while the second capacitor switch 425 is used to select or de-select the second capacitor 424. While the depicted capacitor assembly 420 includes two capacitors, it may be noted that different numbers of capacitors may be employed in various embodiments.

The relative capacitances of the first capacitor 422 and the second capacitor 424 may be selected to provide a desired level of variability between configurations of the detector. In the illustrated embodiment, the capacitance of the first capacitor 422 may be about 1/9 of the capacitance of the second capacitor 424. Thus, the capacitor assembly 420 provides about 1/10 of the capacitance when only the first capacitor 422 is used compared to when the first capacitor 422 and the second capacitor 424 are used. Accordingly, a given pixel may be configured to receive about ten times more electric charge from the diode assembly 410 when both capacitors are used than when only the first capacitor 422 is used.

Generally, at lower radiation dosages or levels, a relatively high proportion of the available photodiode surface area may be selected, and a relatively low capacitance selected to reduce noise. However, as radiation dosage increases, the capacitance of such a combination or configuration may not be adequate. Accordingly, capacitance may be increased, and/or the proportion of photodiode surface area used decreased (to reduce the charge being sent to the capacitor assembly). In various embodiments, a detector may be configured to have various modes of operation, with each mode defined by a combination of photodiodes and capacitors, and each mode configured for use with a particular level of radiation dosage or range of dosages.

In one example scenario, a detector including pixels that in turn include pixel circuits 400 may be configured for three modes of operation. A first mode of operation, for relatively low saturation dosages (e.g., about 50 μR/frame) may be used for example, with fluoroscopic applications. A second mode of operation, for intermediate saturation dosages (e.g., about 500 μR/frame) may be used for example, with surgical cine applications requiring improved signal to noise ratio or image quality compared to fluoroscopic applications. A third mode of operation, for relatively high saturation dosages (e.g., about 5000 μR/frame) may be used for example, with interventional applications that require still higher image quality or signal to noise ratio. Thus, in the example scenario, the pixel including the pixel circuit 400 (as well as a detector including plural pixels) is configured for operation in three different modes, with the modes corresponding to saturation dosages having a ratio of about 1:10:100.

For the first mode of operation (relatively low radiation) a first configuration of photodiodes and capacitors may be selected to provide a relatively high proportion of total surface area available and a relatively low proportion of total capacitance available. Selection of a configuration having low capacitance may help reduce electronic noise. In the illustrated embodiment, the first photodiode 412 and the second photodiode 414 may be selected or included, and the first capacitor 422 but not the second capacitor 424 may be selected or included. Thus, the first configuration for the first mode of operation provides about 100% of the available surface area, but only about 10% of the available capacitance, as the second capacitor 424 has a capacitance about 9 times that of the first capacitor. Of the three modes of operation, the first mode corresponds to the lowest saturation dose (e.g., about 50 µR/frame in some embodiments).

For the second mode of operation (intermediate radiation, for example about ten times the saturation dosage of the first mode of operation) a second configuration of photodiodes and capacitors may be selected. For example, in the second configuration of the illustrated embodiment, the first photodiode 412 and the second photodiode 414 may be selected or included, and the first capacitor 422 and the second capacitor 424 may be selected or included. Thus, the second configuration for the second mode of operation provides about 100% of the available surface area, as well as about 100% of the available capacitance (or about ten times the capacitance of the first configuration). Of the three modes of operation, the second mode corresponds to an intermediate saturation dose (e.g., about 500 µR/frame in some embodiments). Thus, the second configuration is configured for a radiation dosage about ten times more than the first configuration. It may be noted that, in alternate embodiments, a mode or configuration for about ten times the saturation dosage of the first mode may also be achieved by selecting or using only the first photodiode 412 and the first capacitor 414 (e.g., reducing the surface area by about ten times compared to the first configuration).

For the third mode of operation (relatively high radiation, for example about ten times the saturation dosage of the second mode of operation) a third configuration of photodiodes and capacitors may be selected. For example, in the third configuration of the illustrated embodiment, the first photodiode 412 but not the second photodiode 414 may be selected or included, and the first capacitor 422 and the second capacitor 424 may be selected or included. Thus, the third configuration for the third mode of operation provides about only 10% of the available surface area, but about 100% of the available capacitance. Of the three modes of operation, the third mode corresponds to the highest saturation dose (e.g., about 5000 µR/frame in some embodiments). Thus, the third configuration is configured for a radiation dosage about ten times more than the second configuration, and about 100 times more than the first configuration.

It should be noted that the arrangement of components in FIGS. 2-4 is provided by way of example for illustrative purposes, and that other arrangements may be employed in various embodiments. For example, different switching arrangements may be employed in other embodiments. As another example, different numbers or types of capacitors and/or diodes may be employed. It may be noted that the particular configuration, number, and arrangement of components used as part of a pixel may be determined or selected to strike an appropriate balance among, for example, flexibility (e.g., ranges of radiation a detector is configured for use with), capacity (maximum radiation level), pixel size, and manufacturing expense.

FIGS. 5-10 provide examples of photodiode arrangements in accordance with various embodiments. Generally, the photodiode arrangements of FIGS. 5-10 include one or more surface areas disposed within a larger surface area of an additional surface. The surface areas are disposed on a light reception surface (e.g., an upper surface oriented toward a scintillator), and are configured to receive light from the scintillator, which may then be converted to charge which is stored and used to determine the amount of light corresponding to X-ray photons striking the scintillator. The surface areas thus may be understood as light sensing areas. In some embodiments, surface areas of photodiodes may be arranged in a side-by-side fashion. However, generally, it may be desirable to distribute a first, smaller sensing area (or areas) throughout a second, larger area as uniformly as possible or practical, so that a percentage or fraction of light rays absorbed by the smaller area(s) relative to the larger area remains generally constant over the entire diode surface area converting light to charge. The particular shapes of the photodiodes may be selected for a particular application based on uniformity of light reception as well as ease, practicality, or expense of manufacturing or forming the photodiodes. The embodiments depicted below are provided by way of example for illustrative purposes, as other configurations may be employed in alternate embodiments.

It may be noted that, in some embodiments, the amount of charge produced by a given photodiode relative to an amount of light received may vary from the amount of charge produced by a different photodiode. In some embodiments, the ratio of effective surface areas (instead of the ratio of actual surface area) may be controlled or adjusted to provide a desired ratio of electric charge generated in different configurations. By way of example, if a first diode has a surface area that has only 10% of the surface area of a second diode, but produces twice as much electric charge from light received on a per area basis, the first diode may be understood as having an effective surface area that is 20% of the effective surface area of the second diode.

Figure 5:
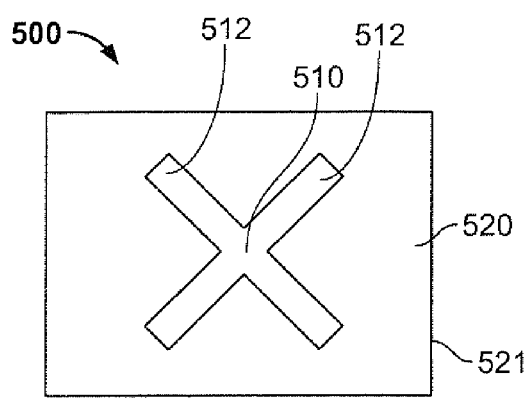
FIG. 5 is a top view of a diode arrangement in accordance with various embodiments.
Figure 6:
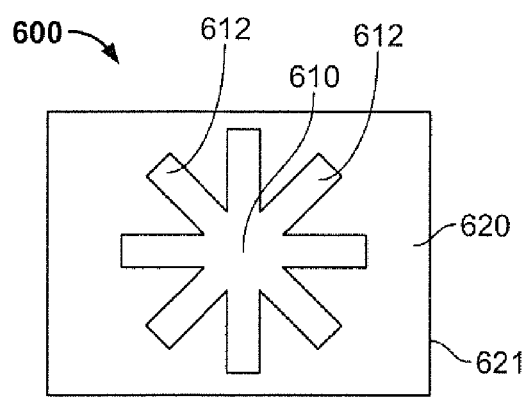
FIG. 6 is a top view of a diode arrangement in accordance with various embodiments.

FIGS. 5 and 6 provide examples of photodiodes including arms radiating from a central point or portion. FIG. 5 provides a top view of a pixel 500 in accordance with various embodiments. The pixel 500 includes a first photodiode 510 having a surface area including arms 512, and a second photodiode 520. The second photodiode 520 has a surface area defining a perimeter 521 within which the first photodiode 510 is disposed. The depicted first photodiode 510 includes four arms 512 extending or radiating from a central portion in a generally "X" shaped pattern. The surface area of the second photodiode 520 is a generally square shaped area having a shape corresponding to the shape of the first photodiode 510 removed. The sum of the surface areas of the first photodiode 510 and the second photodiode 520 is about equal to the sum of a surface area enclosed by the perimeter 521 of the second photodiode, as there may be some loss of light reception area in a border between the two photodiodes. One or both of the first photodiode 510 or the second photodiode 520 may be connected to a corresponding switch or other component configured to control the flow of current from a given photodiode. For example, the second photodiode 520 may be operably connected to a switch, allowing the photodiode 520 to be selected for one or more detector configurations, and to be de-selected for one or more different detector configurations. In some embodiments, the surface area (or effective surface area in some embodiments) of the first photodiode 510 may be about ⅑ the surface area of the second photodiode 520, so that the surface area of the first photodiode 510 may be about 10% of the available surface area. Thus, a ratio of 1:10 of light sensing area may be obtained for the pixel 500 between a first configuration including only the first photodiode 510 and a second configuration including the first photodiode 510 and the second photodiode 520.

FIG. 6 provides a top view of a pixel 600 in accordance with various embodiments. The pixel 600 may be generally similar in respects to the pixel 500 discussed above. The pixel 600 includes a first photodiode 610 having a surface area including arms 612, and a second photodiode 620. The second photodiode 620 has a surface area defining a perimeter 621 within which the first photodiode 610 is disposed. The depicted first photodiode 610 includes 8 arms 612 extending or radiating from a central portion in a generally asterisk shaped pattern. The surface area of the second photodiode 620 is a generally square shaped area having a shape corresponding to the shape of the first photodiode 610 removed.

Figure 7:
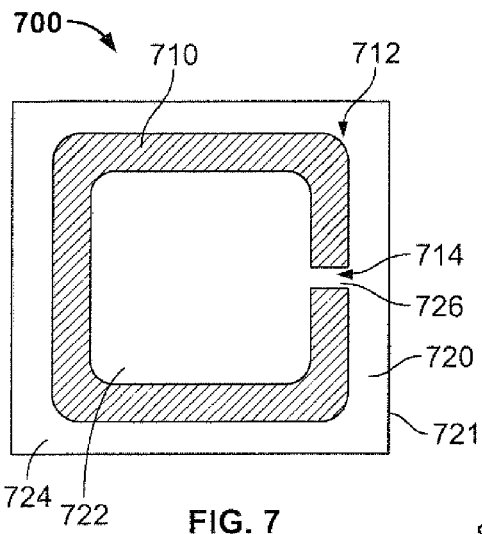
FIG. 7 is a top view of a diode arrangement in accordance with various embodiments.
Figure 8:
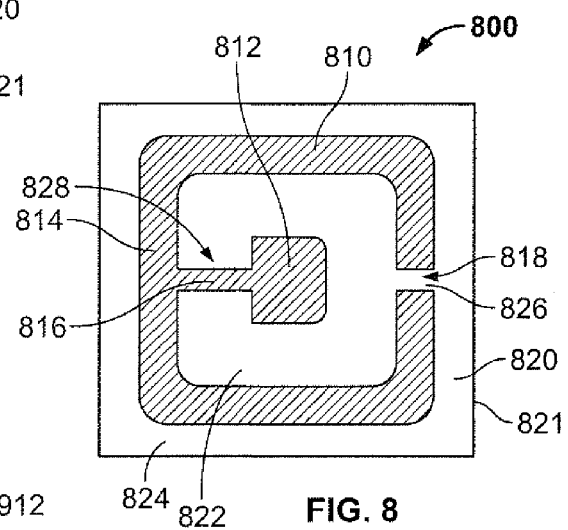
FIG. 8 is a top view of a diode arrangement in accordance with various embodiments.

In some embodiments, in contrast to the shapes including radiating arms as seen in FIGS. 5 and 6, photodiodes may include surface areas defining or corresponding to geometric shapes, such as squares, rectangles, hexagons, octagons, or circles, among others. FIGS. 7 and 8 provide examples of photodiode arrangements formed from geometric shapes. It may be noted that the geometric shapes may include bridges or openings, so that the surface area of any photodiode defines a contiguous area, with each portion of the area in electrical communication with the other portions of the surface area for a given photodiode. In FIGS. 7 and 8, the first photodiode generally includes one or more square areas nested within a larger square area (or areas) of the second photodiode.

FIG. 7 provides a top view of a pixel 700 in accordance with various embodiments. The pixel 700 may be generally similar in certain respects to the pixel 500 discussed above. The pixel 700 includes a first photodiode 710 having a surface area including an open polygon 712 having an opening 714. In the illustrated embodiment, the open polygon 712 is a generally square shaped polygon having an opening 714 to an open area within an interior portion of the open polygon 712. The pixel 700 also includes a second photodiode 720. The second photodiode 720 has a surface area defining a perimeter 721 within which the first photodiode 710 is disposed. The surface area of the second photodiode 720 is a generally square shaped area having a shape corresponding to the shape of the first photodiode 710 removed. The surface area of the depicted second photodiode 720 includes an outer portion 724 and inner portion 722 having the open polygon 712 generally interposed therebetween. The surface area of the depicted second photodiode 720 also includes a bridge 726 that extends through the opening 714 of the open polygon 712 to join the outer portion 724 and the inner portion 722. Thus, the surface area of the second photodiode 720 defines a contiguous area.

FIG. 8 provides a top view of a pixel 800 in accordance with various embodiments. The pixel 800 may be generally similar in certain respects to the pixel 500 discussed above. The pixel 800 includes a first photodiode 810 and a second photodiode 820. Each of the photodiodes of the depicted pixel 800 includes inner and outer portions corresponding to generally square shapes, with the inner and outer portions joined by bridges. The first photodiode 810 has a surface area including an inner shape 812 joined to an outer shape 814 by a bridge 816. The outer shape 814 includes an opening 818 configured to allow a bridge between inner and outer shapes of the second photodiode 820. The second photodiode 820 has a surface area defining a perimeter 821 within which the first photodiode 810 is disposed. The surface area of the second photodiode 820 is a generally square shaped area having a shape corresponding to the shape of the first photodiode 810 removed. The surface area of the depicted second photodiode 820 includes an outer portion 824 and inner portion 822 having the outer portion 814 of the first photodiode 810 generally interposed therebetween. The surface area of the depicted second photodiode 820 also includes a bridge 826 that extends through the opening 818 of the first photodiode 810 to join the outer portion 824 and the inner portion 822. The second photodiode 820 also includes an opening 828 configured to accommodate the bridge 816 of the first photodiode 810.

Figure 9:
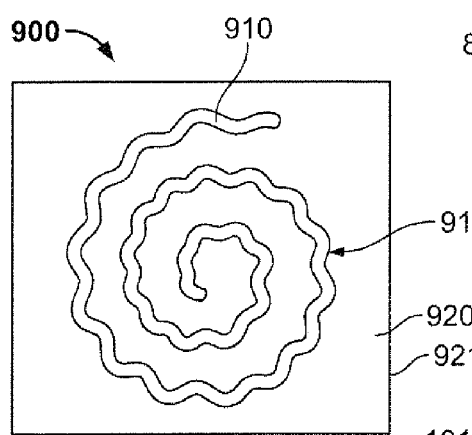
FIG. 9 is a top view of a diode arrangement in accordance with various embodiments.
Figure 10:
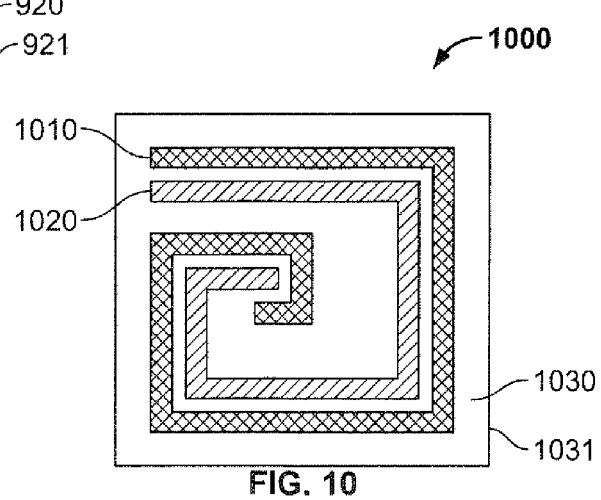
FIG. 10 is a top view of a diode arrangement in accordance with various embodiments.

FIGS. 9 and 10 provide examples of spiral shapes used for photodiode surface areas. For example, an irregular curved spiral is depicted in FIG. 9, and a regular rectilinear spiral is depicted in FIG. 10. An irregular spiral as used herein may be understood as including segments having discontinuous curves or lines and an irregular width, whereas a regular spiral as used herein may be understood as including segments having smooth or continuous lines or curves, or segments having generally constant widths. FIG. 10 also provides an example of a pixel having plural photodiodes having surface areas disposed within a perimeter of a larger surface area of an additional photodiode.

FIG. 9 provides a top view of a pixel 900 in accordance with various embodiments. The pixel 900 may be generally similar in certain respects to the pixel 500 discussed above. The pixel 900 includes a first photodiode 910 having a surface area configured as an irregular curved spiral 912. The pixel 900 also includes a second photodiode 920. The second photodiode 920 has a surface area defining a perimeter 921 within which the first photodiode 910 is disposed. The surface area of the second photodiode 920 is a generally square shaped area having a shape corresponding to the shape of the first photodiode 910 removed.

FIG. 10 provides a top view of a pixel 1000 in accordance with various embodiments. The pixel 1000 may be generally similar in certain respects to the pixel 500 discussed above. The pixel 1000 includes a first photodiode 1010, a second photodiode 1020, and a third photodiode 1030. The first photodiode 1010 (indicated by "x" shaped hatching in FIG. 10) and the second photodiode 1020 (indicated by single line hatching in FIG. 10) have a surface area configured as a regular rectilinear spiral. In some embodiments, the widths of the segments of the spirals may be about the same for both the first photodiode 1010 and the second photodiode 1020, while in other embodiments the segment widths for the first photodiode 1010 may be different than the segment widths of the second photodiode 1020. The surface areas of the first photodiode 1010 and the second photodiode 1020 are nested within each other as the surface areas extend within the perimeter 1031 of the third photodiode 1030. The surface area of the third photodiode 1030 is a generally square shaped area having a shape corresponding to the shape of the first photodiode 1010 removed and a shape corresponding to the shape of the second photodiode 1020 removed.

It may be noted that use of plural photodiodes disposed within a perimeter of an additional photodiode as shown, for example, in FIG. 10, may provide additional flexibility in the choice of percentage of surface area employed. For example, in some embodiments, the first photodiode 1010 may include about 10% of the total surface area (or effective surface area) of the pixel 1000, the second photodiode 1020 may include about 20% of the total surface area (or effective surface area), and the third photodiode 1030 may be about 70% of the total surface area (or effective surface area). The second photodiode 1020 and the third photodiode 1030 may be operably connected to switches configured for selection or de-selection of the second and third photodiodes. Thus, the pixel 1000 may include a first configuration including the first photodiode 1010 that uses about 10% of the available surface area, a second configuration including the first photodiode 1010 and the second photodiode 1020 that uses about 30% of the available surface area, a third configuration including the first photodiode 1010 and the third photodiode 1030 that uses about 80% of the available surface area, and a fourth configuration that includes the first photodiode 1010, the second photodiode 1020, and the third photodiode 1030 that uses about 100% of the available surface area.

Figure 11:
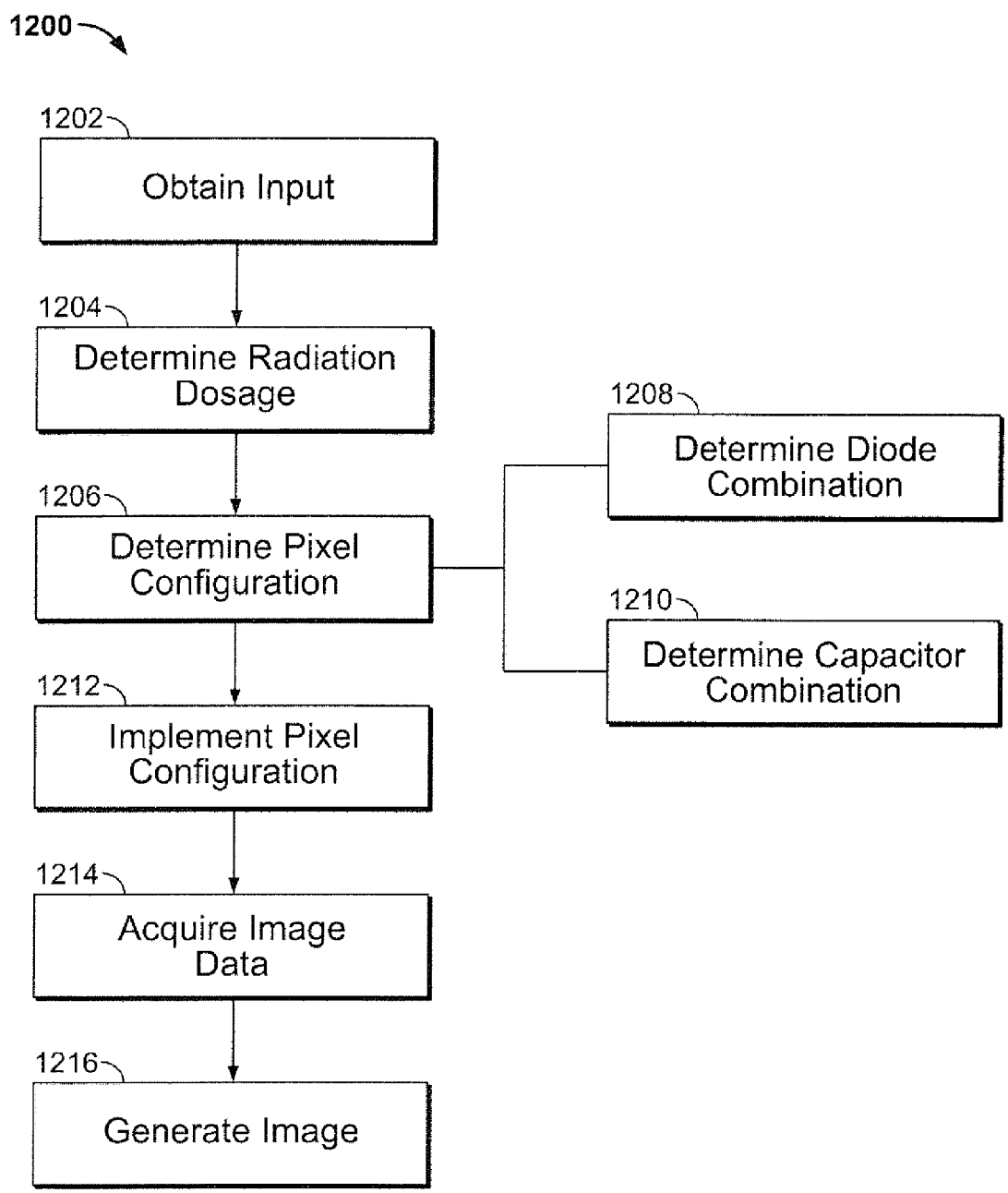
FIG. 11 is a flowchart of a method for selecting a detector configuration in accordance with various embodiments.

FIG. 11 provides a flowchart of a method 1200 for imaging an object (e.g., a portion of a human or animal patient) in accordance with various embodiments. The method 1200, for example, may employ or be performed by structures or aspects of various embodiments (e.g., systems and/or methods) discussed herein. In various embodiments, certain steps may be omitted or added, certain steps may be combined, certain steps may be performed simultaneously, certain steps may be performed concurrently, certain steps may be split into multiple steps, certain steps may be performed in a different order, or certain steps or series of steps may be re-performed in an iterative fashion. In various embodiments, portions, aspects, and/or variations of the method 1200 may be able to be used as one or more algorithms to direct hardware to perform one or more operations described herein.

At 1202, an input is obtained. Generally, the input provides information corresponding to an imaging procedure to be performed. The information may include an expected radiation dosage for an upcoming imaging procedure, or may include information from which a radiation dosage may be determined, such as type of imaging procedure and/or additional imaging parameters. The input may be provided by an operator, for example using a touchscreen and/or a keyboard. Alternatively or additionally, the input may be provided by an imaging system that will perform the upcoming imaging procedure.

At 1204, a radiation dosage is determined. In some embodiments, the radiation dosage may have been provided at 1202 and is identified as the radiation dosage specified at 1202. In other embodiments, the radiation dosage may be determined using information provided at 1202. The radiation dosage may be specified by a specific numerical value or a range defined by specific numerical values, or qualitatively specified using descriptions of levels or ranges such as "high," "low," or "intermediate," among others. In various embodiments, a processing unit may access one or more databases that include tabulated radiation dosage levels corresponding to imaging parameters provided at 1202. In still other embodiments, radiation dosage may be estimated based on type of imaging procedure to be performed. For example, a first, low radiation dosage may be estimated for fluoroscopic applications, a second, intermediate radiation dosage may be estimated for cine applications requiring higher signal to noise ratio, and a third, high radiation dosage may be estimated for interventional applications requiring still higher signal to noise.

At 1206, pixel configuration is determined. The pixel configuration may be determined automatically by a processing unit (e.g., processing unit 150) based upon the determined radiation dosage. For example, a processing unit may have access to one or more databases tabulating pixel configurations against ranges of radiation dosages. A combination of photodiodes and/or a combination of capacitors for each pixel may be determined. Each pixel may be similarly configured in various embodiments. In the illustrated embodiment, a diode combination is selected at 1208, and a capacitor combination is selected at 1210. The diode combination may be selected to provide usage of a desired portion of available photodiode surface area. The capacitor combination may be selected to provide a desired amount of capacitance based on the electric charge expected to be received from the selected diode combination, while maintaining capacitance at or near a minimum level to reduce electronic noise. Generally, a higher proportion of available photodiode surface area and/or a lower proportion of available capacitance may be employed in lower radiation dosage applications, while a higher proportion of available capacitance and/or a lower proportion of available photodiode surface area may be employed in higher radiation dosage applications.

At 1212, the determined pixel configuration is implemented. For example, a processing unit may, based on the determined configuration, transmit control signals to a detector that sets the states of one or more switches in each pixel to select or de-select photodiodes and/or capacitors to achieve the desired configuration.

At 1214, x-ray image data are acquired. In various embodiments, X-rays may pass through an object and impact a scintillator. The scintillator, responsive to being impacted by X-rays, may then generate light photons from a portion of the scintillator corresponding to the portion impacted by the X-rays. The light photons may then be received by the light sensor configured at 1212. For each pixel that is impacted by light from the scintillator, charge may be generated by the photodiode(s) of the pixel and stored by the capacitor(s) of the pixel. The charge stored during a given imaging cycle corresponding to the reception of light from the scintillator may be measured and recorded.

At 1216, one or more images are generated. The image may be generated using the image data acquired at 1214 (e.g., the total signal recorded for each pixel during the imaging cycle). For example, a shade or value of a gray scale may be assigned, based on the recorded signal for a given pixel. In some embodiments, a fluoroscopic image (e.g., an image presented in real time on a screen) may be provided. Alternatively or additionally, one or more images may be saved and/or provided in hard copy form for subsequent study or analysis.

Figure 12:
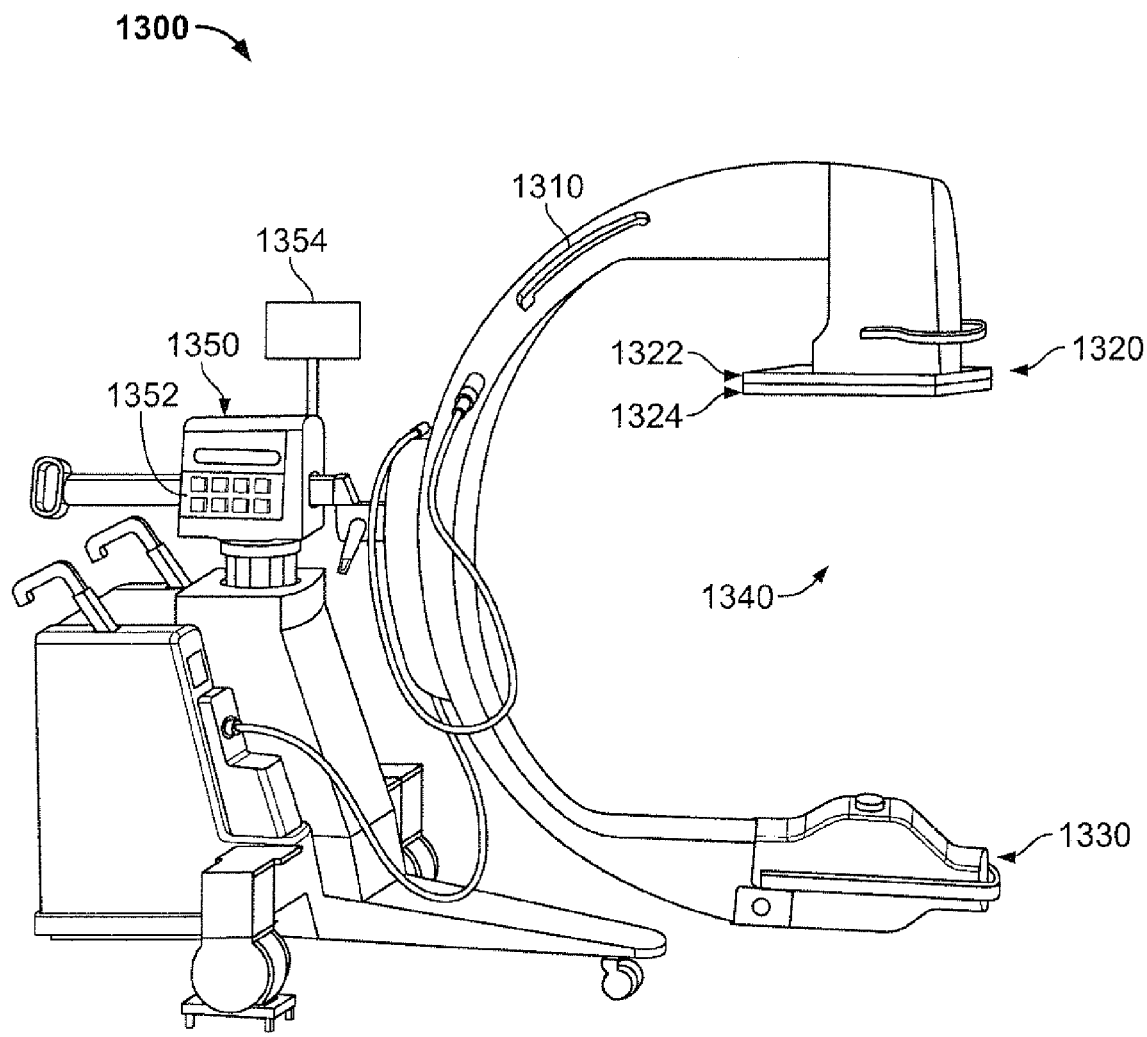
FIG. 12 is a pictorial view of an exemplary imaging system fanned in accordance with various embodiments.

Various methods and algorithms described herein may be used to select diode and/or capacitor configurations for pixels of a pixelated detector, and may be embodied as a set of instructions that are stored on a computer and implemented using, for example, software, hardware, a combination thereof, and/or a tangible non-transitory computer readable medium. The set of instructions and associated processing circuitry may be part of or used in connection with an imaging system such as imaging system 1300 shown in FIG. 12. It may be noted that the example in FIG. 12 depicts a surgical C-arm system, but other x-ray imaging systems or configuration may be employed additionally or alternatively in various embodiments. For example, a detector employing configurable pixels as described herein may be movable or interchangeable between different x-ray imaging systems. As one example, a detector according to various embodiments may be movable or interchangeable between a surgical C-arm system and an interventional system, with the detector configuration (e.g., configuration of selected or employed photodiodes and capacitors) adjusted for use with different systems and/or applications.

FIG. 12 provides a pictorial view of an imaging system 1300 formed in accordance with various embodiments. In FIG. 12, the imaging system 1300 is depicted as a mobile imaging system including wheels 1302; however, additionally or alternatively, imaging systems may, for example, be configured as floor mounted interventional imaging systems. The imaging system 1300 includes an arm 1310, an X-ray detector 1320, an X-ray source 1330, and a processing and control unit 1350. The X-ray detector 1320 and the X-ray source 1330 are disposed on opposite ends of the win 1310 (which is shaped in a generally "C" shape in the illustrated embodiment), with an opening 1340 provided between the X-ray source 1330 and the X-ray detector 1320.

To use the imaging system 1300, an object to be imaged (e.g., a portion of a patient) is placed in the opening 1340 between the X-ray source 1330 and the X-ray detector 1320, such that X-rays from the X-ray source 1330 will pass through the object and impact the X-ray detector 1320. In the illustrated embodiment, the X-ray detector 1320 includes a scintillator 1324 and a light sensor 1322, which may be configured as discussed herein. X-rays from the X-ray source 1330 pass through the object and impact the scintillator 1324. The scintillator 1324 produces light photons responsive to the impact of X-rays, with the light photons striking the light sensor 1322. Data from the light sensor 1322 is obtained by the processing and control unit 1350 to generate an image based on the attenuation of the X-rays as the X-rays pass through the object to be imaged.

The processing and control unit 1350 is generally configured to control the operation of the X-ray detector 1320 and the X-ray source 1330. For example, the processing and control unit 1350 may incorporate one or more aspects of the processing unit 150 discussed herein in connection with FIG. 1.

In the illustrated embodiment, the processing and control unit 1350 includes a module 1354 that is configured to implement various methods and algorithms (or aspects thereof) described herein. The module 1354 may be configured to include one or more aspects of the processing unit 150 discussed herein. For example, the module 1354 may be configured to receive an expected radiation dosage for a given procedure as an input. Responsive to receipt of the expected radiation dosage, the module 1354 may determine an appropriate combination of diodes and/or capacitors to be utilized for one or more pixels to provide a desired image quality while maintaining a minimized or reduced level of electronic noise. The module 1354 may also set the states of one or more switches of the one or more pixels to implement the determined combination of diodes and/or capacitors. The module 1354 may be implemented as a piece of hardware that is installed in the processing and control unit 1350. Optionally, the module 1354 may be implemented as a set of instructions that are installed on the processing and control unit 1350. The set of instructions may be stand-alone programs, may be incorporated as subroutines in an operating system installed on the processing and control unit 1350, may be functions in an installed software package on the processing and control unit 1350, and the like. It should be understood that the various embodiments are not limited to the arrangements and instrumentality shown in the drawings.

The processing and control unit 1350 may be configured to both control the set-up of the X-ray detector 1320 and the X-ray source 1330 (e.g., to set imaging parameters, to set a configuration of photodiodes and/or capacitors of the X-ray detector, to set energy levels of the X-ray source 1330, or the like), as well as to control the operation or performance of an imaging procedure, and to obtain imaging data (e.g., signal levels of pixels corresponding to light impacting photodiodes of the pixels). Further, the processing and control unit 1350 in some embodiments may be configured to generate an image based on acquired data and/or to display a generated image, for example on a screen viewable by an operator. In the illustrated embodiment, the processing and control unit 1350 includes an input unit 1352 configured to obtain input from an operator.

It should be noted that the particular arrangement of components (e.g., the number, types, placement, or the like) of the illustrated embodiments may be modified in various alternate embodiments. In various embodiments, different numbers of a given module or unit may be employed, a different type or types of a given module or unit may be employed, a number of modules or units (or aspects thereof) may be combined, a given module or unit may be divided into plural modules (or sub-modules) or units (or sub-units), a given module or unit may be added, or a given module or unit may be omitted.

It should be noted that the various embodiments may be implemented in hardware, software or a combination thereof. The various embodiments and/or components, for example, the modules, or components and controllers therein, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as a solid state drive, optical drive, and the like. The storage device may also be other similar means for loading computer programs or other instructions into the computer or processor.

As used herein, the term "computer," "controller," and "module" may each include any processor-based or microprocessor-based system including systems using microcontrollers, reduced instruction set computers (RISC), application specific integrated circuits (ASICs), logic circuits, GPUs, FPGAs, and any other circuitry capable of executing the functions described herein. The above examples are exemplary only, and are thus not intended to limit in any way the definition and/or meaning of the term "module" or "computer."

The computer, module, or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer, module, or processor as a processing machine to perform specific operations such as the methods and processes of the various embodiments described and/or illustrated herein. The set of instructions may be in the form of a software program. The software may be in various forms such as system software or application software and which may be embodied as a tangible and non-transitory computer readable medium. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program. The individual components of the various embodiments may be virtualized and hosted by a cloud type computational environment, for example to allow for dynamic allocation of computational power, without requiring the user concerning the location, configuration, and/or specific hardware of the computer system It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments of the invention without departing from their scope. While the dimensions and types of materials described herein are intended to define the parameters of the various embodiments of the invention, the embodiments are by no means limiting and are exemplary embodiments. Many other embodiments will be apparent to those of skill in the art upon reviewing the above description. The scope of the various embodiments of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments of the invention, and also to enable any person skilled in the art to practice the various embodiments of the invention, including making and using any devices or systems and performing any incorporated methods. The patentable scope of the various embodiments of the invention is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal language of the claims.

What is claimed is:

1. An X-ray detector comprising a light sensor configured to receive light energy from a scintillator receiving X-rays, the light sensor comprising:
    a grid of pixels having a light reception surface oriented toward the scintillator and configured to receive light from the scintillator, wherein each pixel comprises:
        a diode assembly disposed on the light reception surface and configured to produce electric charge responsive to light received by the diode assembly, the diode assembly comprising plural diodes selectably configurable in plural combinations, wherein an amount of the electric charge produced by the diode assembly varies based on a selection of diode combination, wherein the plural diodes of the diode assembly comprise a first diode and a second diode, the first diode having a first surface area, the second diode having a second surface area defining an outer perimeter, wherein the first surface area of the first diode is disposed within the outer perimeter of the second surface area of the second diode;
        a control assembly operably connected to the diode assembly and configured to selectably configure the diodes based on an expected radiation dosage for an upcoming imaging procedure; and
        a capacitor assembly operably connected to the diode assembly and configured to receive and store the electric charge from the diode assembly during the imaging procedure.

2. The X-ray detector of claim 1, wherein the capacitor assembly comprises plural capacitors selectably configurable in plural combinations, wherein an amount of storage capacity of the capacitor assembly varies based on a selection of capacitor combination.

3. The X-ray detector of claim 2, wherein the second diode has a greater surface area for receiving light than the first diode, and wherein the capacitor assembly comprises a first capacitor and a second capacitor, the second capacitor having a greater capacitance than the first capacitor.

4. The X-ray detector of claim 3, wherein:
    a first mode of detector operation corresponding to a first, low range of radiation dosage is characterized by a diode combination including the first and second diodes and a capacitor combination including the first capacitor but not the second capacitor;
    a second mode of detector operation corresponding to a second, intermediate range of radiation dosage that is higher than the first range is characterized by a diode combination including the first and second diodes and a capacitor combination including the first and second capacitors; and
    a third mode of detector operation corresponding to a third, high range of radiation dosage that is higher than the second range is characterized by a diode combination including the first diode but not the second diode, and a capacitor combination including the first and second capacitors.

5. The X-ray detector of claim 4, wherein the second mode is configured for about ten times the radiation dosage of the first mode, and the third mode is configured for about ten times the radiation dosage of the second mode.

6. The X-ray detector of claim 1, wherein the first surface area is substantially uniformly distributed within the second surface area, wherein a proportion of light striking the first and second diodes relative to each other remains generally constant over the light reception surface of the pixel.

7. The X-ray detector of claim 1, wherein the control assembly is configured to activate a first subset of light sensing areas of the diode assembly to configure the diode assembly in a first diode combination corresponding to a first radiation dosage level, and to activate a second subset of light sensing areas of the diode assembly to configure the diode assembly in a second diode combination corresponding to a second radiation dosage.

8. The X-ray detector of claim 1, wherein the diode assembly comprises a third diode, the third diode having a third surface area defining an additional outer perimeter, and wherein the first surface area of the first diode and the second surface area of the second diode are disposed within the additional outer perimeter of the third surface area of the third diode.

9. The X-ray detector of claim 1, further comprising a selection module comprising processing circuitry, the selection module configured to select at least a combination of diodes responsive to a received input corresponding to an expected radiation dosage to be received by the scintillator.

10. A method for manufacturing an X-ray detector comprising a light sensor configured to receive light energy from a scintillator, the method comprising:
providing a diode assembly on a light reception surface of the pixel, the diode assembly comprising plural diodes selectably configurable in plural combinations, wherein an amount of electric charge produced by the diode assembly varies based on a selection of diode combination, wherein providing the diode assembly comprises providing a first diode having a first surface area and a second diode having a second surface area defining an outer perimeter, wherein the first surface area of the first diode is disposed within the outer perimeter of the second surface area of the second diode;
providing a capacitor assembly operably connected to the diode assembly, the capacitor assembly configured to receive and store the electric charge from the diode assembly; and
providing a selection module operably connected to the diode assembly and the capacitor assembly, the selection module comprising processing circuitry configured to select at least a combination of diodes responsive to a received input corresponding to an expected radiation dosage to be received by the scintillator.

11. The method of claim 10, wherein the first surface area is substantially uniformly distributed within the second surface area, wherein a proportion of light striking the first and second diodes relative to each other remains generally constant over the light reception surface of the pixel.

12. The method of claim 11, wherein the first surface area has a regular configuration comprising at least one of substantially linear portions or substantially continuously curved portions disposed within the second surface area.

13. The method of claim 11, wherein the diode assembly comprises a third diode, the third diode having a third surface area defining an additional outer perimeter, and wherein the first surface area of the first diode and the second surface area of the second diode are disposed within the additional outer perimeter of the third surface area of the third diode.

14. A method for using an X-ray system comprising a detector having a light sensor configured to receive light energy from a scintillator comprising:
receiving, at a processing unit, an input corresponding to an expected radiation dosage to be used during an upcoming imaging procedure;
selecting, with the processing unit, a first diode combination of a diode assembly to activate a first subset of light sensing areas of the detector when the input corresponds to a first level of radiation; and
selecting, with the processing unit, a second diode combination of the diode assembly to activate a second subset of light sensing areas of the detector when the input corresponds to a second level of radiation;
wherein the diode assembly comprises a first diode having a first surface area and a second diode having a second surface area defining an outer perimeter, wherein the first surface area of the first diode is disposed within the outer perimeter of the second surface area of the second diode.

15. The method of claim 14 further comprising selecting a capacitor combination for a capacitor assembly of the pixel of the detector based on the input.

16. The method of claim 14, wherein the first surface area is substantially uniformly distributed within the second surface area, wherein a proportion of light striking the first and second diodes relative to each other remains generally constant over the light reception surface of the pixel.

* * * * *